US012293931B2

(12) United States Patent
Kakinuma

(10) Patent No.: US 12,293,931 B2
(45) Date of Patent: May 6, 2025

(54) TAPE ROLL AND TAPE MOUNTER

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 170 days.

(21) Appl. No.: 17/809,328

(22) Filed: Jun. 28, 2022

(65) Prior Publication Data

US 2023/0010011 A1  Jan. 12, 2023

(30) Foreign Application Priority Data

Jul. 12, 2021  (JP) .............................. 2021-114915

(51) Int. Cl.
*H01L 21/67* (2006.01)
*B65H 75/18* (2006.01)

(52) U.S. Cl.
CPC ..... *H01L 21/67294* (2013.01); *B65H 75/182* (2013.01); *H01L 21/67132* (2013.01); *H01L 21/67282* (2013.01)

(58) Field of Classification Search
CPC .................................................. B65H 75/182
See application file for complete search history.

(56) References Cited

U.S. PATENT DOCUMENTS

| | | | |
|---|---|---|---|
| 6,402,086 B1 * | 6/2002 | Myers, Jr. ............ | B65H 75/182 242/600 |
| 6,755,583 B1 * | 6/2004 | Maruyama ............... | B41J 15/02 400/613 |
| 7,007,887 B2 * | 3/2006 | van de Camp ......... | B32B 37/12 40/660 |
| 7,040,566 B1 * | 5/2006 | Rodrian ............. | A47K 10/3845 242/564.2 |
| 2007/0162175 A1 | 7/2007 | Segawa et al. | |
| 2022/0111672 A1 * | 4/2022 | Jacques .................. | B41F 33/00 |

FOREIGN PATENT DOCUMENTS

| | | |
|---|---|---|
| JP | 05238115 A | 9/1993 |
| JP | 2005154148 A | 6/2005 |
| JP | 2007012807 A | 1/2007 |
| JP | 2009206161 A | 9/2009 |
| JP | 2020198408 A | 12/2020 |

OTHER PUBLICATIONS

Office Action issued in corresponding Japanese patent application No. 2021-114915, dated Feb. 19, 2025.
Search Report issued in corresponding Japanese patent application No. 2021-11491, dated Feb. 20, 2025.

* cited by examiner

*Primary Examiner* — William A. Rivera
(74) *Attorney, Agent, or Firm* — Greer Burns & Crain Ltd.

(57) ABSTRACT

A tape roll includes a cylindrical core, a strip-shaped tape wound on the core, and a marking portion that represents type information of the strip-shaped tape and that is applied to an inner peripheral surface of the core. Preferably, the type information of the strip-shaped tape includes at least one piece of type information selected from a group consisting of a width, a length, a material, an adhesive force, and a shelf life of the tape, and the marking portion has slots or an identification code representing the at least one piece of type information. A tape mounter for bonding, to a workpiece, the tape which is wound on the core of the tape roll is also disclosed.

12 Claims, 5 Drawing Sheets

TAPE ROLL AND TAPE MOUNTER

BACKGROUND OF THE INVENTION

Field of the Invention

The present invention relates to a tape roll and a tape mounter.

Description of the Related Art

When grinding a variety of plate-shaped workpieces such as semiconductor device wafers and resin package substrates to thin them or to divide them into singulated device chips, it is a common practice to bond an adhesive tape to the workpieces for protecting them or facilitating handling of the singulated chips. Such an adhesive tape is marketed wound on a cylindrical core, in other words, as a tape roll, and is set on a tape mounter with an insertion member which is arranged in the tape mounter, the insertion member being inserted in the core. The adhesive tape is bonded to a workpiece by the tape mounter (see, for example, JP 2009-206161A).

SUMMARY OF THE INVENTION

Such adhesive tapes come in a variety of types with different widths, different material types, different adhesive forces, and so on, and a tape roll chosen in conformity with a workpiece and its processing methods is set on a tape mounter. There is however a potential problem that a tape roll of a different type may be set by mistake. Accordingly, a tape mounter was contrived to have functions to register the type of a tape roll, the type being described on wrapping paper or the like of the tape roll, in the tape mounter and to ascertain whether the type of the tape roll matches a tape roll type registered beforehand.

However, wrong information may be inputted when an operator inputs information by key operation. If such wrong information is inputted, a wrong type of adhesive tape may be bonded to a workpiece.

The present invention therefore has as objects thereof the provision of a tape roll and a tape mounter which can suppress bonding of a wrong type of adhesive tape to a workpiece while reducing an increase in operator's man-hour.

In accordance with a first aspect of the present invention, there is provided a tape roll including a cylindrical core, a strip-shaped tape wound on the core, and a marking portion that represents type information of the strip-shaped tape and is applied to an inner peripheral surface of the core.

Preferably, the type information of the strip-shaped tape may include at least one piece of type information selected from a group consisting of a width, a length, a material, an adhesive force, and a shelf life of the tape, and the marking portion may have slots or an identification code representing the at least one piece of type information.

In accordance with a second aspect of the present invention, there is provided a tape mounter for bonding, to a workpiece, a tape that is wound on a core of a tape roll. The tape mounter includes a table configured to hold the workpiece thereon, a tape roll support configured to be inserted into the core of the tape roll and rotatably support the tape roll thereon, a bonding unit configured to pull out the tape from the tape roll supported on the tape roll support, and to bond the tape to the workpiece held on the table, an inspection unit including a sensor configured to detect type information from a marking portion applied to an inner peripheral surface of the core of the tape roll mounted on the tape roll support, a registration section configured to register beforehand, as reference information, type information of a tape roll chosen in conformity with the workpiece and processing methods therefor, and a collation section configured to collate the type information detected by the sensor with the reference information registered beforehand in the registration section, and an alarm unit configured to report an inspection result obtained by the inspection unit. The sensor is arranged on a support portion of the tape roll support, the support portion being to be inserted into the core, and faces the inner peripheral surface of the core of the tape roll mounted on the tape roll support.

Preferably, the inspection unit may further include a current time setting section configured to acquire a current time at predetermined time intervals, the type information to be detected by the sensor may be a shelf life of the tape, the reference information may be the current time, and the collation section may be configured to collate the current time with the shelf life of the tape roll.

It is to be noted that the term "current time" as used herein generally means "current dates" or "current month or months."

The present invention exhibits an advantageous effect of enabling to suppress bonding of a wrong type of adhesive tape to a workpiece while reducing an increase in operator's man-hour.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

With reference to the attached drawings, a description will hereinafter be made in detail about an embodiment of a first aspect and an embodiment of a second aspect of the present invention. However, the present invention shall not be limited by details that will be described in the subsequent embodiments. The elements of configurations that will hereinafter be described include those readily conceivable to persons skilled in the art and substantially the same ones. Further, the configurations that will hereinafter be described can be combined appropriately. Furthermore, various omissions, replacements, and modifications of configurations can be made without departing from the spirit of the present invention.

Figure 1:
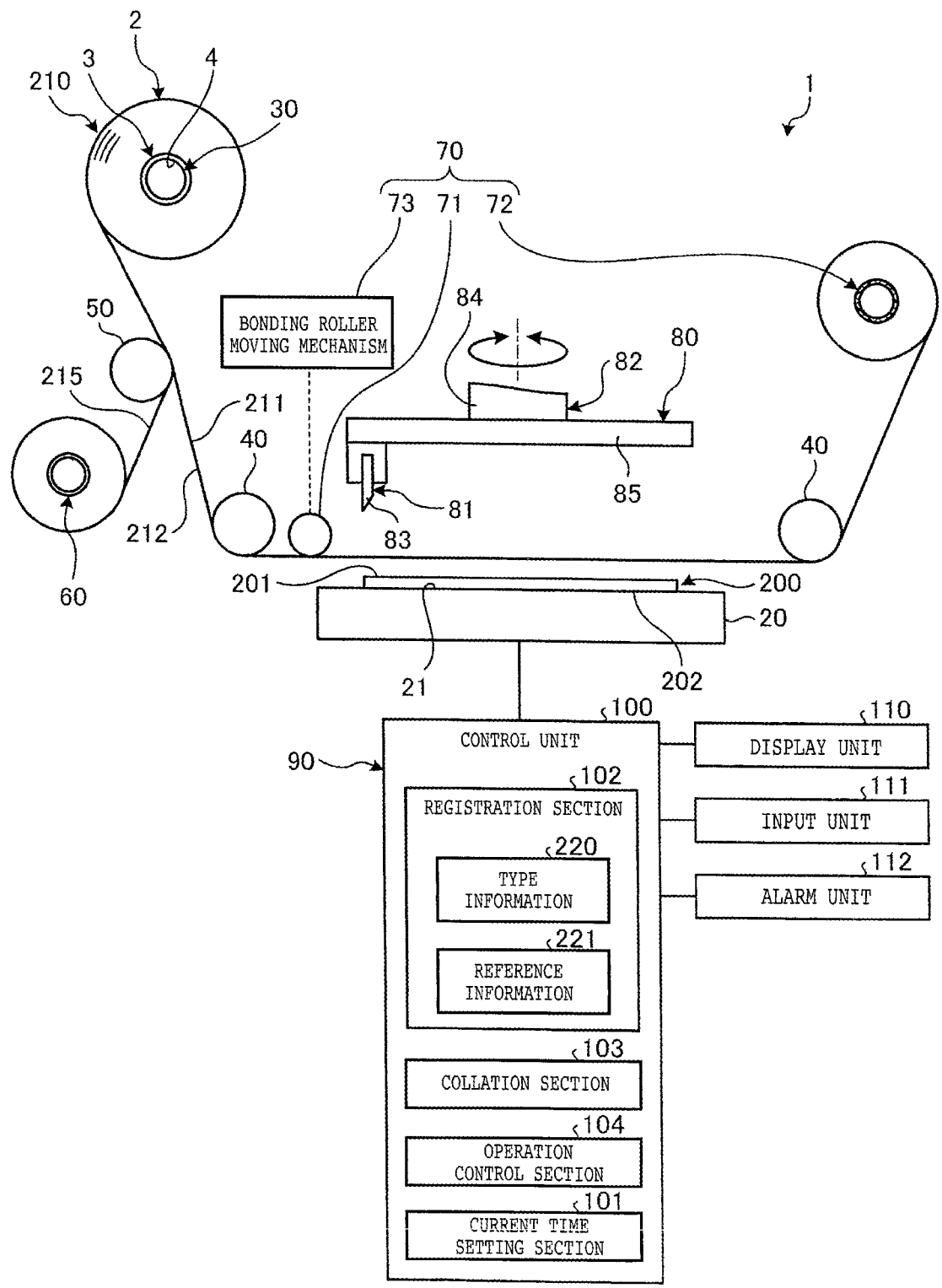
FIG. 1 is a side view schematically illustrating an outline configuration of a tape mounter according to an embodiment of a second aspect of the present invention.
Figure 2:
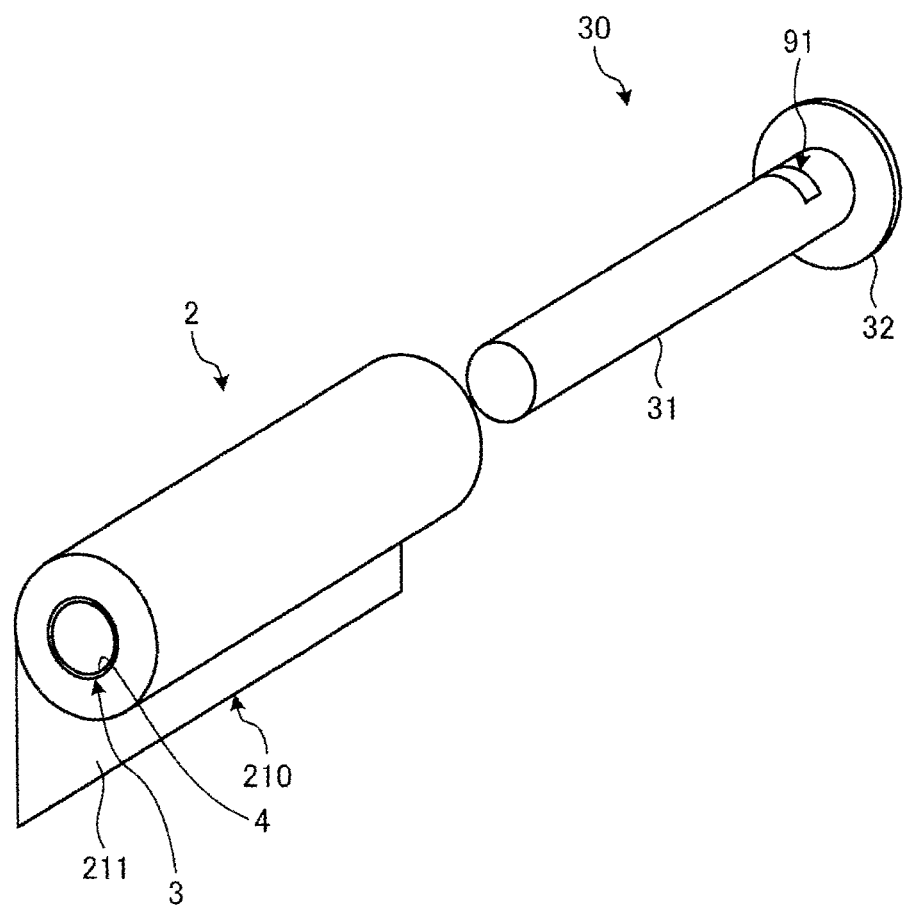
FIG. 2 is a perspective view illustrating a tape roll according to an embodiment of a first aspect of the present invention and a tape roll support of the tape mounter illustrated in FIG. 1, the tape roll support being to be used for insertion into a core of the tape roll to rotatably support the tape roll.
Figure 3:
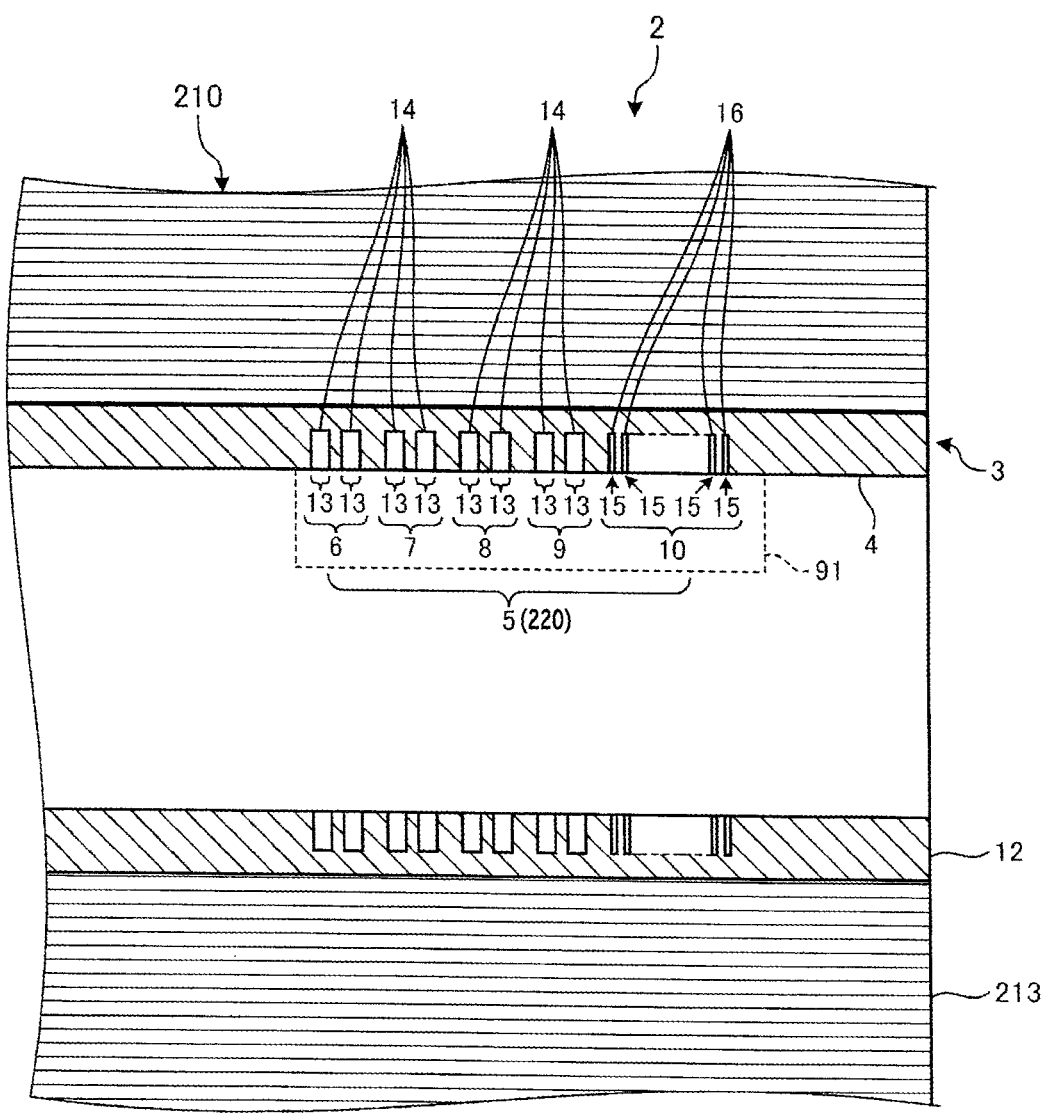
FIG. 3 is a fragmentary enlarged cross-sectional view of the tape roll illustrated in FIG. 2.

A tape roll 2 according to the embodiment of the first aspect and a tape mounter 1 according to the embodiment of the second aspect of the present invention will be described based on FIGS. 1 to 3. FIG. 1 is a side view schematically illustrating an outline configuration of the tape mounter 1 according to the embodiment of the second aspect. FIG. 2 is a perspective view illustrating the tape roll 2 according to the embodiment of the first aspect and a tape roll support 30 of the tape mounter 1 illustrated in FIG. 1, the tape roll support 30 being to be used for insertion into a core 3 of the tape roll 2 to rotatably support the tape roll 2. FIG. 3 is a fragmentary enlarged cross-sectional view of the tape roll 2 illustrated in FIG. 2.

The tape mounter 1 according to the embodiment of the second aspect, which is illustrated in FIG. 1, is an apparatus for bonding, to a front surface 201 of a workpiece 200, an adhesive tape 210 (hereinafter referred to simply as "the tape 210") which is wound on the core 3 of the tape roll 2. In this embodiment, the workpiece 200 to which the tape 210 is bonded by the tape mounter 1 is a disc-shaped wafer, such as a semiconductor wafer or an optical device wafer, using silicon, sapphire, gallium arsenide, or the like as a substrate. In the workpiece 200, devices are formed in respective regions defined by a plurality of scribe lines (streets) on the front surface 201 of the workpiece 200, in other words, the substrate.

The devices are, for example, integrated circuits such as normal integrated circuits (ICs) or large scale integration (LSI) circuits, or image sensors such as complementary metal oxide semiconductors (CMOS), resin package substrates, glass substrates, and ceramic substrates. In this embodiment, the tape mounter 1 bonds the tape 210 to the front surface 201 of the workpiece 200. In this invention, however, the tape mounter 1 may bond the tape 210 to a back surface 202 on a side opposite to the front surface 201 of the workpiece 200.

The tape 210, which is to be bonded to the front surface 201 of the workpiece 200 by the tape mounter 1 according to the embodiment of the second aspect, has flexibility as a whole, and includes a base material layer 21 formed from a non-adhesive synthetic resin and an adhesive layer 212 formed from a synthetic resin that has adhesiveness to the front surface 201 of the workpiece 200 and that is laminated on the base material layer 211. As the tape 210, a variety of types of tapes, different in width, length, the material of the base material layer 211, and the adhesive force of the adhesive layer 212, is usable. Further, the tape 210 carries its own shelf life specified therefor.

In the embodiment of the first aspect, the tape 210 is formed as an elongated strip-shaped member, and is wound in a roll shape with a release paper 215 (see FIG. 1) applied to the adhesive layer 212, and thus the tape roll 2 according to this embodiment is configured. As illustrated in FIGS. 2 and 3, the tape roll 2 has a cylindrical core 3 and the tape 210 wound on an outer peripheral surface of the core 3.

In the tape roll 2 of the embodiment of the first aspect, the tape 210 is wound on the outer peripheral surface of the core 3 such that the base material layer 211 is positioned on an inner peripheral side. The release paper 215 serves to protect the adhesive layer 212 of the tape 210. In this embodiment, while the release paper 215 is sequentially peeled off from a leading end thereof by the tape mounter 1, the tape 210 is bonded to the front surface 201 of the workpiece 200, and is cut along an outer edge of the workpiece 200.

As illustrated in FIG. 3, a marking portion 5 which represents type information 220 of the tape 210 is applied to an inner peripheral surface 4 of the core 3 of the tape roll 2. The marking portion 5 serves to represent the type information 220 of the tape 210 wound on the outer peripheral surface of the core 3. In this embodiment, the type information 220 includes the width and length, the material of the base material layer 211, the adhesive force of the adhesive layer 212, and the shelf life of the tape 210 wound on the outer peripheral surface of the core 3.

In the embodiment of the first aspect, the marking portion 5 includes, as illustrated in FIG. 3, a width marking area 6, a length marking area 7, a material marking area 8, an adhesive force marking area 9, and a shelf life marking area 10. The width marking area 6 indicates the width of the tape 210 wound on the outer peripheral surface of the core 3, the length marking area 7 indicates the length of the tape 210 wound on the outer peripheral surface of the core 3, the material marking area 8 indicates the material of the base material layer 211 of the tape 210 wound on the outer peripheral surface of the core 3, the adhesive force marking area 9 indicates the adhesive force of the adhesive layer 212 of the tape 210 wound on the outer peripheral surface of the core 3, and the shelf life marking area 10 indicates the shelf life of the tape 210 wound on the outer peripheral surface of the core 3.

In this embodiment, the width marking area 6, the length marking area 7, the material marking area 8, and the adhesive force marking area 9 each include two regions 13 on the inner peripheral surface 4 of the core 3, and the two regions 13 are apart by predetermined distances, respectively, from one end 12 (see FIG. 3) of the core 3. Depending on whether slots 14 are formed opening in the inner peripheral surface 4 at these two regions 13, the width or length, the material of the base material layer 211, or the adhesive force of the adhesive layer 212 of the tape 210 wound on the outer peripheral surface of the core 3 is indicated. Further, the shelf life marking area 10 includes a plurality of regions 15 on the inner peripheral surface 4 of the core 3, and the regions 15 are apart by predetermined distances, respectively, from the one end 12 of the core 3. Depending on whether slots 16 are formed opening in the inner peripheral surface 4 at the respective regions 15, the shelf life of the tape 210 wound on the outer peripheral surface of the core 3 is indicated.

FIG. 3 illustrates an example in which the slots 14 and 16 are formed at all the regions 13 and 15, respectively. In this embodiment, the slots 14 and 16 are each formed over the entire periphery of the inner peripheral surface 4 of the core 3. Owing to the inclusion of the width marking area 6, the length marking area 7, the material marking area 8, the adhesive force marking area 9, and the shelf life marking area 10 as described above, the marking portion 5 includes the slots 14 and 16, and therefore includes information that indicates the width and length, the material of the base material layer 211, the adhesive force of the adhesive layer 212, and the shelf life of the tape 210 wound on the outer peripheral surface of the core 3.

The tape mounter 1 according to the embodiment of the second aspect bonds the tape 210 to the front surface 201 of the workpiece 200, and cuts off the tape 210 at an unwanted part thereof extending out from the outer edge of the workpiece 200, in other words, cuts the tape 210 along the peripheral edge of the workpiece 200.

As illustrated in FIG. 1, the tape mounter 1 includes a table 20, a tape roll support 30, a plurality of transfer rollers 40, a peel roller 50, a release paper take-up unit 60, a bonding roller 71, a tape cutting unit 80, a tape take-up unit 72, and an inspection unit 90.

The table 20 serves to hold the workpiece 200. The table 20 is disposed on a mounter bed (not illustrated), and has a holding surface 21 on which the workpiece 200 is to be placed. The holding surface 21 is parallel to a horizontal direction. The table 20 holds under suction the workpiece 200 which is placed on the holding surface 21, by a suction source (not illustrated).

The tape roll support 30 is inserted into the core 3 of the tape roll 2, and serves to support the tape roll 2 rotatably about its axial center. The tape roll support 30 is arranged above an end portion of the table 20 in this embodiment. The tape roll support 30 is disposed rotatably about its axial center and, as illustrated in FIG. 2, includes a support portion 31 and a flange portion 32. The support portion 31 is formed in a cylindrical shape having an axial center parallel to the horizontal direction, and is to be inserted into the core 3. The flange portion 32 projects outwardly in a radial direction from an end of the support portion 31.

With the support portion 31 inserted in the core 3 and the flange portion 32 maintained in contact with both the one end 12 of the core 3 and a widthwise edge portion 213 (see FIG. 3) of the tape 210, the tape roll support 30 sets the tape roll 2 thereon. The tape roll support 30 fixedly holds the inner peripheral surface 4 of the core 3 of the tape roll 2 on the outer peripheral surface of the support portion 31, and allows the support portion 31 and the flange portion 32 to rotate about the axial center of the support portion 31, whereby the tape 210 is paid out successively from the leading end thereof to above the holding surface 21 of the table 20.

In this embodiment, two transfer rollers 40 are disposed, one of which is arranged between the table 20 and the tape roll support 30 above the one end portion of the table 20, and the other one of which is arranged above an opposite end portion of the table 20, whereby the transfer rollers 40 serve to transfer the tape 210 from the tape roll support 30 to the tape take-up unit 72 and also to apply a tension to the tape 210 in order to suppress occurrence of a slack in the tape 210. The transfer rollers 40 are each formed in a cylindrical shape parallel to the axial center of the tape roll support 30, and are each disposed rotatably about its axial center. The transfer rollers 40 at outer peripheral surfaces thereof press the base material layer 211 of the tape 120 toward the table 20 and applies a tension to the tape 210.

The peel roller 50 is arranged between the tape roll support 30 and the one transfer roller 40, and serves to peel off, from the tape 210, the release paper 215 which is applied to the adhesive layer 212 of the tape 210. The peel roller 50 is formed in a cylindrical shape with an axial center thereof extending parallel to the axial centers of the tape roll support 30 and transfer rollers 40, and is disposed rotatably about its axial center. The peel roller 50 at an outer peripheral surface thereof presses the release paper 215 applied to the tape 210 paid out from the tape roll support 30, and peels off the release paper 215 from the tape 210.

The release paper take-up unit 60 serves to take up the release paper 215 peeled off by the peel roller 50 from the tape 210 paid out from the tape roll support 30. The release paper take-up unit 60 is arranged below the tape roll support 30 in this embodiment. The release paper take-up unit 60 is formed in a cylindrical shape with an axial center thereof extending parallel to the axial centers of the tape roll support 30, the transfer rollers 40, and the peel roller 50, and is rotated about its axial center by a driving device (not illustrated) such as a motor, whereby the release paper take-up unit 60 takes up, on an outer peripheral surface thereof, the release paper 215 peeled off from the tape 210.

The bonding roller 71 presses the tape 210, which has been supplied to above the holding surface 21 of the table 20 from the tape roll support 30, toward the front surface 201 of the workpiece 200 held under suction on the holding surface 21 of the table 20, so that the bonding roller 71 serves to bond the tape 210 to the front surface 201 of the workpiece 200. The bonding roller 71 is arranged above the holding surface 21 of the table 20. The bonding roller 71 is formed in a cylindrical shape with an axial center thereof extending parallel to the axial centers of the tape roll support 30, the transfer rollers 40, the peel roller 50, and the release paper take-up unit 60, and is supported rotatably about its axial center. By a bonding roller moving mechanism 73, the bonding roller 71 is movable up and down in a direction orthogonal to the holding surface 21 of the table 20, and is also movable along the holding surface 21 in a direction orthogonal to its axial center. The bonding roller 71 bonds the tape 210 to the front surface 201 of the workpiece 200 held on the table 20, when the bonding roller 71 is moved along the holding surface 21 in a state that it has been moved down by the bonding roller moving mechanism 73.

The tape cutting unit 80 serves to cut off the tape 210 at the unwanted part thereof extending out from the outer edge of the workpiece 200, after the bonding roller 71 has bonded the tape 210 to the workpiece 200. In this embodiment, the unwanted part of the tape 210 is a part on an outer peripheral side of the outer edge of the workpiece 200. The tape cutting unit 80 is arranged above the holding surface 21 of the table 20.

In this embodiment, the tape cutting unit 80 includes a cutter blade 81 and a cutter blade moving mechanism 82. The cutter blade 81 has at a lower extremity thereof a cutting blade 83 having a height greater than the thickness of the tape 210 supplied to above the holding surface 21 of the table 20. The cutting blade 83 of the cutter blade 81 is positioned to face the tape 210, which has been supplied to above the holding surface 21 of the table 20, and also the outer edge of the workpiece 200.

The cutter blade moving mechanism 82 serves to move the cutter blade 81 along the outer edge of the workpiece 200. The cutter blade moving mechanism 82 can move the cutter blade 81 up and down in the direction orthogonal to the holding surface 21 of the table 20, and can also move the cutter blade 81 along a peripheral direction about an axial center thereof that is parallel to the direction orthogonal to the holding surface 21. The cutter blade moving mechanism 82 includes a spindle 84, an arm 85, and an air cylinder or the like (not illustrated). The spindle 84 is arranged above a center of the holding surface 21 of the table 20, and is rotated about its axial center by a driving device (not illustrated) such as a motor. The arm 85 extends outwardly in radially opposite directions from the spindle 84 in parallel with the holding surface 21 of the table 20, and at an end thereof, supports the cutter blade 81. The air cylinder or the like moves the arm 85 up and down together with the spindle 84.

The tape take-up unit 72 serves to take up the unwanted part of the tape 210 after the tape 210 has been cut along the outer edge of the workpiece 200 by the tape cutting unit 80. In this embodiment, the tape take-up unit 72 is arranged above a horizontally opposite end portion of the table 20 and the other transfer roller 40. The tape take-up unit 72 is formed in a cylindrical shape with an axial center thereof extending parallel to the axial centers of the tape roll support 30, the transfer rollers 40, the peel roller 50, the release paper take-up unit 60, and the bonding roller 71, and is rotated about its axial center by a driving device (not illustrated) such as a motor, whereby the tape take-up unit 72 takes up the tape 210 on an outer peripheral surface thereof. By taking up the tape 210 on the outer peripheral surface, the tape take-up unit 72 pulls out the tape 210 from the tape roll 2 supported on the tape roll support 30.

In this embodiment, the bonding roller 71, the bonding roller moving mechanism 73, and the tape take-up unit 72 make up a bonding unit 70 which pulls out the tape 210 from the tape roll 2 supported on the tape roll support 30 and bonds the tape 210 to the workpiece 200 held on the table 20.

Figure 5:
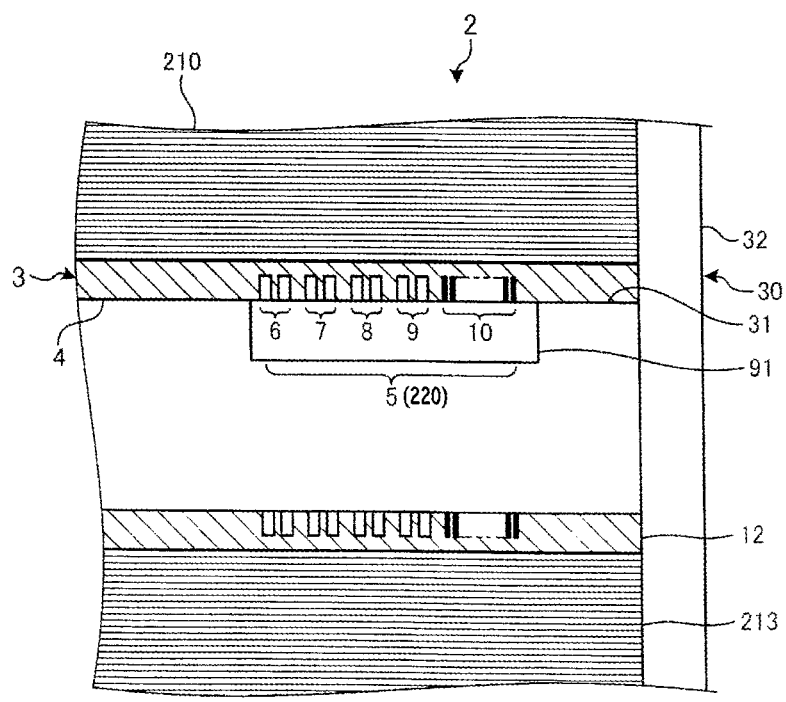
FIG. 5 is a cross-sectional view illustrating the tape roll held on the support portion of the tape roll support illustrated in FIG. 4.

The inspection unit 90 includes a sensor 91 illustrated in FIG. 2, etc., and a control unit 100 illustrated in FIG. 1. The sensor 91 serves to detect the type information 220 from the marking portion 5 formed in the inner peripheral surface 4 of the core 3 of the tape roll 2 mounted on the tape roll support 30. In this embodiment, the sensor 91 is arranged, as illustrated in FIG. 5, at a position, on the outer peripheral surface of the support portion 31, where the sensor 91 faces the marking portion 5 in a radial direction of the support portion 31 (in other words, a position where the sensor 91 faces the inner peripheral surface 4 of the core 3), when the tape roll 2 is set on the tape roll support 30.

When the support portion 31 of the tape roll support 30 is inserted into the core 3 of the tape roll 2 and the flange portion 32 is brought into contact with the one end 12 of the core 3 and the widthwise edge portion 213 of the tape 210, the sensor 91 faces the marking portion 5 in the radial direction of the support portion 31. The sensor 91 reads the individual marking areas 6, 7, 8, 9, and 10 of the marking portion 5, and outputs, to the control unit 100, the type information 220 represented by the marking areas 6, 7, 8, 9, and 10, specifically, the width and length, the material of the base material layer 211, the adhesive force of the adhesive layer 212, and the shelf life of the tape 210 wound on the outer peripheral surface of the core 3. In this embodiment, the sensor 91 is configured, for example, by fiber sensors or photoelectric sensors.

The control unit 100 controls the above-mentioned elements of the tape mounter 1 individually or in combination, thereby making the tape mounter 1 perform bonding operation of the tape 210 to the workpiece 200. The control unit 100 is a computer which includes an arithmetic processing unit having a microprocessor such as a central processing unit (CPU), a storage device having a memory such as a read only memory (ROM) or a random access memory (RAM), and an input/output interface device. The arithmetic processing unit of the control unit 100 performs arithmetic processing according to a computer program stored in the storage device, and outputs control signals to the above-mentioned elements of the tape mounter 1 via the input/output interface device to control the tape mounter 1.

The control unit 100 is connected to a display unit 110, an input unit 111, and an alarm unit 112. The display unit 110 is configured by a liquid crystal display device or the like which displays statuses, images, and/or the like of the bonding operation. The input unit 111 is used when an operator registers processing conditions and the like. The alarm unit 112 reports to the operator by sound or light. Therefore, the tape mounter 1 includes the display unit 110, the input unit 111, and the alarm unit 112. The input unit 111 is configured by at least one of a touch panel incorporated in the display unit 110 and an external input device such as a keyboard. The alarm unit 112 reports an inspection result obtained by the inspection unit 90.

The control unit 100 also includes a current time setting section 101, a registration section 102, a collation section 103, and an operation control section 104. The current time setting section 101 serves to acquire a current time at predetermined time intervals. Reference information 221 chosen in conformity with the workpiece 200 and its processing methods, specifically, the width and length, the material of the base material layer, and the adhesive force of the adhesive layer of a tape roll which is to be bonded to the workpiece 200, the reference information 221 being inputted by the operator or the like via the input unit 111, is registered beforehand in the registration section 102. In short, the reference information 221 inputted by the operator or the like is registered beforehand in the registration section 102. Further, the registration section 102 acquires and stores the type information 220, detected by the sensor 91, of the tape roll 2 which is supported on the tape roll support 30. Therefore, the type information 220 of the tape roll 2 held on the tape roll support 30 is registered in the registration section 102. Furthermore, the registration section 102 stores, as additional information to the reference information 221, the current time acquired by the current time setting section 101. The current time included in the reference information 221 as described above is updated at the predetermined time intervals. It is to be noted that the current time setting section 101 is not an essential element and may hence be omitted.

The collation section 103 collates the type information 220 of the tape roll 2 supported on the tape roll support 30, the type information 220 having been detected by the sensor 91 and registered in the registration section 102, with the reference information 221 inputted beforehand by the operator or the like via the input unit 111. The collation section 103 determines whether or not the result of the collation is preferred for performing the bonding operation to bond the tape 210 to the workpiece 200. If the result of the collation is determined not to be preferred for performing the bonding operation to bond the tape 210 to the workpiece 200, the collation section 103 operates the alarm unit 112, and stops the tape mounter 1, in other words, the bonding operation.

The operation control section 104 controls the above-mentioned elements of the tape mounter 1 individually or in combination to make the tape mounter 1 perform the bonding operation.

The functions of the registration section 102 are realized by storing the reference information 221 and the type information 220 through performance of arithmetic processing by the arithmetic processing unit according to the computer program stored in the storage device. The functions of the current time setting section 101, the collation section 103, and the operation control section 104 are realized through performance of arithmetic processing by the arithmetic processing unit according to the computer program stored in the storage device.

Figure 4:
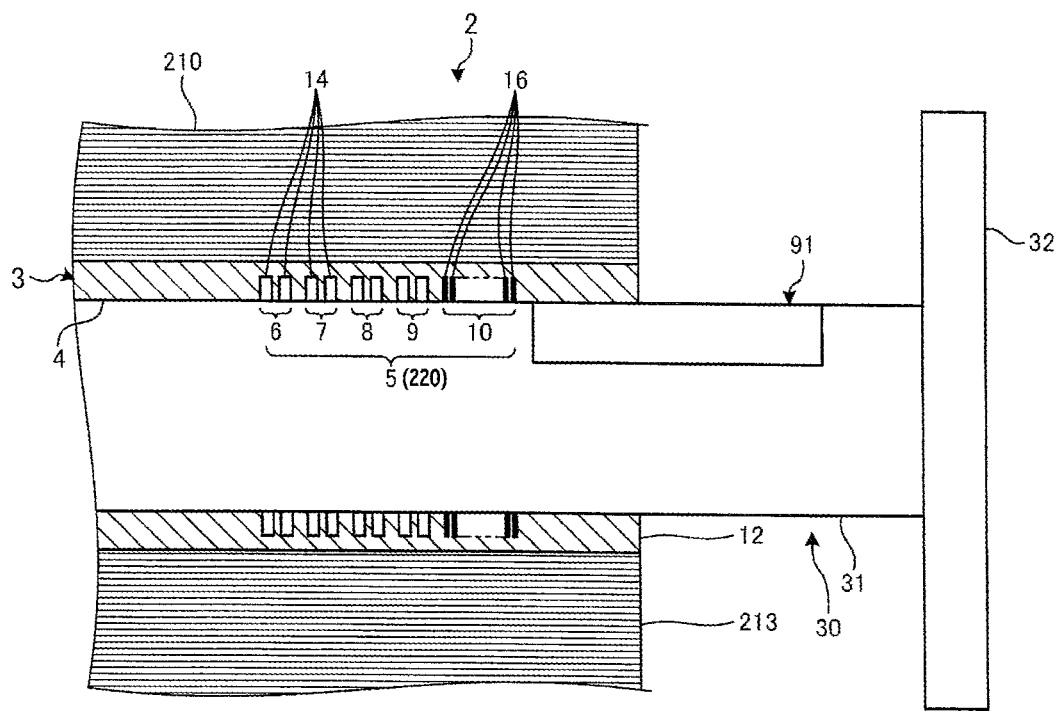
FIG. 4 is a cross-sectional view illustrating how a support portion of the tape roll support illustrated in FIG. 2 is inserted into the core of the tape roll.

A description will next be made of an example of the bonding operation by the tape mounter 1. FIG. 4 is a cross-sectional view illustrating how the support portion 31 of the tape roll support 30 illustrated in FIG. 2 is inserted into the core 3 of the tape roll 2. FIG. 5 is a cross-sectional view illustrating the tape roll 2 mounted on the support portion 31 of the tape roll support 30 illustrated in FIG. 4.

First, the operator or the like places the back surface 202 of the workpiece 200 on the holding surface 21 of the table 20, registers processing conditions in the control unit 100, and registers the above-mentioned reference information 221 in the registration section 102 of the control unit 100. As illustrated in FIG. 4, the operator or the like then inserts the support portion 31 of the tape roll support 30 into the core 3 of the tape roll 2. As a consequence, the flange portion 32 of the tape roll support 30 comes into contact with the one end 12 of the core 3 and, at the same time, also comes into contact with the widthwise edge portion 213 of the tape 210, whereby, as illustrated in FIG. 5, the tape roll 2 is mounted on the tape roll support 30.

As a result, the sensor 91 faces, in the radial direction of the support portion 31, the marking portion 5 formed in the inner peripheral surface 4 of the core 3 of the tape roll 2 mounted on the tape roll support 30. Next, the operator or the like pulls out the leading end portion of the tape 210 from the tape roll 2, and brings the release paper 215 applied to the tape 210 into contact with the outer peripheral surface of the peel roller 50. After that, the operator or the like brings the base material layer 211 of the tape 210 into contact with the outer peripheral surfaces of the transfer rollers 40, and attaches the base material layer 211 to the outer peripheral surface of the tape take-up unit 72. In the meantime, the operator or the like attaches the release paper 215, which has been peeled off from the tape 210 by its contact with the outer peripheral surface of the peel roller 50, to the outer peripheral surface of the release paper take-up unit 60, whereby the tape roll 2 is set on the tape mounter 1.

When the control unit 100 receives a start instruction of bonding operation, the tape mounter 1 starts the bonding operation. In the bonding operation, the sensor 91 reads the individual marking areas 6, 7, 8, 9, and 10 of the marking portion 5, and outputs to the control unit 100 the type information 220 represented by the individual marking areas 6, 7, 8, 9, and 10, specifically, the width and length, the material of the base material layer 211, the adhesive force of the adhesive layer 212, and the shelf life of the tape 210 wound on the outer peripheral surface of the core 3.

In the bonding operation, the registration section 102 of the control unit 100 registers the type information 220 detected by the sensor 91 and represented by the individual marking areas 6, 7, 8, 9, and 10, specifically, the width and length, the material of the base material layer 211, the adhesive force of the adhesive layer 212, and the shelf life of the tape 210 wound on the outer peripheral surface of the core 3. The collation section 103 of the control unit 100 collates the type information 220 with the reference information 221, both of which are registered in the registration section 102, and determines whether or not the result of the collation is preferred for performing the bonding operation to bond the tape 210 to the workpiece 200.

If the result of the collation is determined not to be preferred for performing the bonding operation to bond the tape 210 to the workpiece 200, the collation section 103 operates the alarm unit 112, and stops the tape mounter 1, in other words, the bonding operation. If the result of the collation is determined to be preferred for performing the bonding operation to bond the tape 210 to the workpiece 200, on the other hand, the collation section 103 allows the bonding operation to continue without operating the alarm unit 112.

In this embodiment, the collation section 103 collates the current time included in the reference information 221 registered in the registration section 102 with the shelf life included in the type information 220 registered in the registration section 102. If the current time has already passed the shelf life, or if a difference between the current time and the shelf life is equal to or shorter than a predetermined time (for example, a predetermined number of days or month(s)) although the current time has not passed the shelf life yet, the collation section 103 determines that the result of the collation is not preferred for performing the bonding operation to bond the tape 210 to the workpiece 200. In this embodiment, if the current time has not passed the shelf life yet and, at the same time, the difference between the current time and the shelf life has already exceeded the predetermined time, the collation section 103 determines that the result of the collation is preferred for performing the bonding operation to bond the tape 210 to the workpiece 200. It is to be noted that the term "predetermined time" as used herein means, for example, a time within which the current time reaches the shelf life during the bonding operation.

In the present invention, those to be collated by the collation section 103 are not limited to the current time included in the reference information 221 registered in the registration section 102 and the shelf life included in the type information 220 registered in the registration section 102. In the present invention, the collation section 103 may collate the tape width included in the reference information 221 registered in the registration section 102 with the width of the tape 210 included in the type information 220 registered in the registration section 102, and, if they do not match, may determine that this collation result is not preferred for performing the bonding operation to bond the tape 210 to the workpiece 200. If they match, on the other hand, the collation section 103 may determine that the collation result is preferred for performing the bonding operation to bond the tape 210 to the workpiece 200.

In the present invention, the collation section 103 may collate the tape length included in the reference information 221 registered in the registration section 102 with the length of the tape 210 included in the type information 220 registered in the registration section 102, and, if they do not match, may determine that this collation result is not preferred for performing the bonding operation to bond the tape 210 to the workpiece 200. If they match, on the other hand, the collation section 103 may determine that the collation result is preferred for performing the bonding operation to bond the tape 210 to the workpiece 200.

In the present invention, the collation section 103 may collate the material of the material layer of the tape included in the reference information 221 registered in the registration section 102 with the material of the base material layer 211 of the tape 210 included in the type information 220 registered in the registration section 102, and, if they do not match, may determine that this collation result is not preferred for performing the bonding operation to bond the tape 210 to the workpiece 200. If they match, on the other hand, the collation section 103 may determine that the collation result is preferred for performing the bonding operation to bond the tape 210 to the workpiece 200.

In the present invention, the collation section 103 may collate the adhesive force of the adhesive layer of the tape included in the reference information 221 registered in the registration section 102 with the adhesive force of the adhesive layer 212 of the tape 210 included in the type information 220 registered in the registration section 102, and, if they do not match, may determine that this collation result is not preferred for performing the bonding operation to bond the tape 210 to the workpiece 200. If they match, on the other hand, the collation section 103 may determine that the collation result is preferred for performing the bonding operation to bond the tape 210 to the workpiece 200.

If the collation section 103 of the control unit 100 determines that the collation result is preferred for performing the bonding operation to bond the tape 210 to the workpiece 200, the tape mounter 1 starts the bonding operation. Described specifically, the operation control section 104 of the control unit 100 of the tape mounter 1 moves the bonding roller 71 down and also moves it along the holding surface 21, whereby the tape 210 is bonded to the front surface 201 of the workpiece 200. Then, the tape mounter 1 moves the bonding roller 71 up, and makes the cutter blade moving mechanism 82 move the cutter blade 81 down while the cutter blade moving mechanism 82 rotates and moves the cutter blade 81 about the axial center of the spindle 84. Next, the tape mounter 1 cuts the tape 210 by moving the cutting blade 83 of the cutter blade 81 along the outer edge of the workpiece 200 with the cutting blade 83 cut in the tape 210.

After the tape 210 has been cut, the operation control section 104 of the control unit 100 moves the tape cutting unit 80 up, and then releases the suction holding of the workpiece 200 by the holding surface 21 of the table 20. Next, the operation control section 104 makes the tape take-up unit 72 take up the tape 210 as much as needed for the bonding to the single piece of workpiece 200, so that the tape 210 is moved over a length corresponding to the single piece of the workpiece 200. After that, the tape mounter 1 ends the bonding operation of the tape 210.

The tape mounter 1 according to the above-described embodiment includes the sensor 91 which is used by the inspection unit 90 to detect the type information 220 from the marking portion 5 formed in the inner peripheral surface 4 of the core 3 of the tape roll 2. The tape mounter 1 can therefore register the type information 220 of the tape 210 in the registration section 102 by mounting the tape roll 2 on the tape roll support 30.

In the tape mounter 1, the collation section 103 can therefore collate the type information 220, which is detected by the sensor 91, with the reference information 221, which has been registered beforehand, by simply mounting the tape roll 2 on the tape roll support 30. As a result, the tape roll 2 and the tape mounter 1 exhibit an advantageous effect of enabling to suppress bonding of a wrong type of adhesive tape to the workpiece 200 without specifically increasing operator's work, in other words, while reducing an increase in operator's man-hour.

Modification

Figure 6:
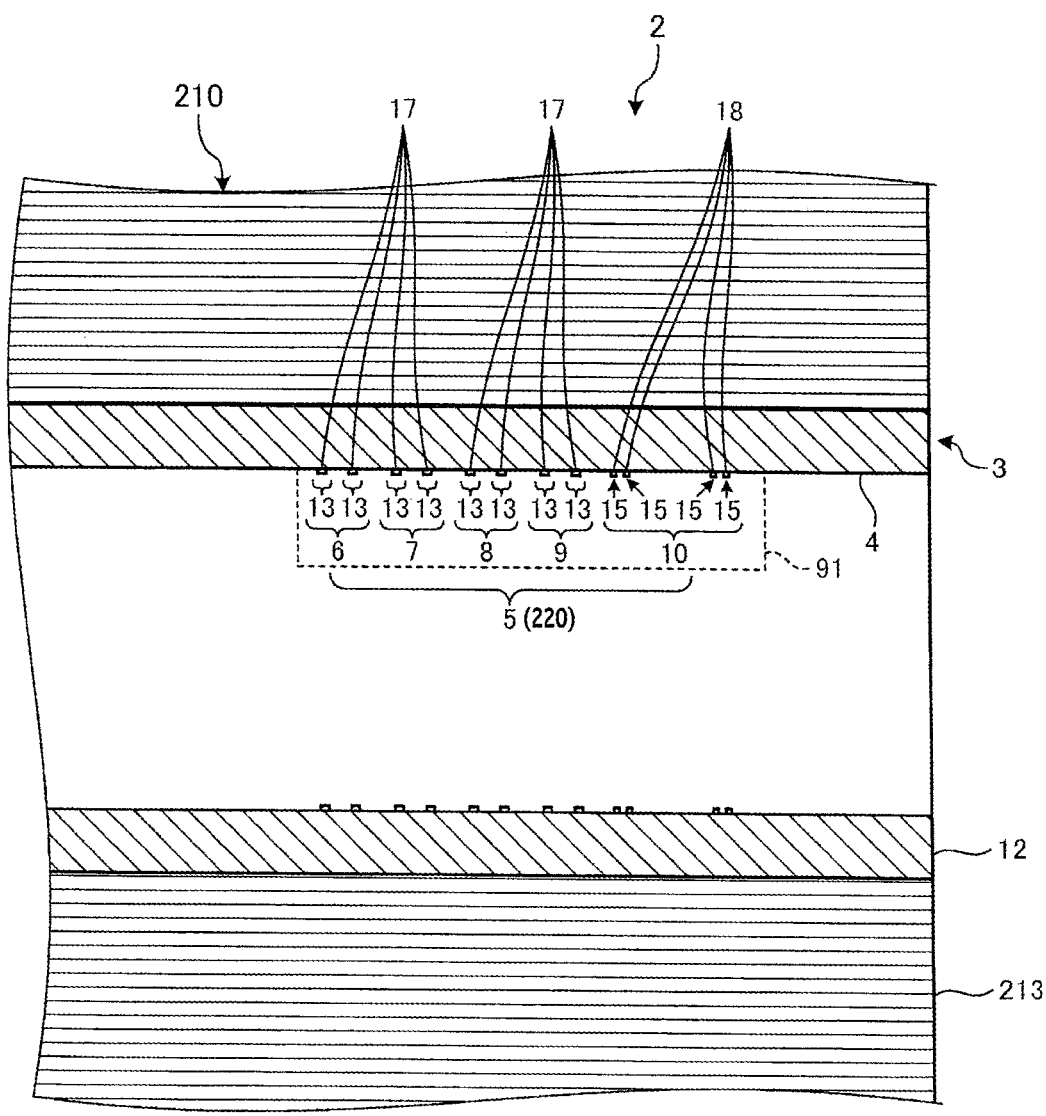
FIG. 6 is a fragmentary enlarged cross-sectional view of a tape roll according to a modification of the embodiment of the first aspect illustrated in FIG. 2.

A tape roll 2 according to a modification of the embodiment of the first aspect of the present invention as illustrated in FIG. 2 will be described based on FIG. 6. FIG. 6 is a fragmentary enlarged cross-sectional view of the tape roll 2 of the modification. It is to be noted that, in FIG. 6, the same elements as those in the embodiment of the first aspect are identified by the same reference numerals, and their description is omitted.

In the tape roll 2 of this modification, the marking portion 5 represents the width and length, the material of the base material layer 211, and the adhesive force of the adhesive layer 212 of the tape 210 wound on the outer peripheral surface of the core 3, depending on whether or not identification codes 17 are applied to the individual regions 13 of the individual marking areas 6, 7, 8, and 9 by printing or the like. In the tape roll 2 of this modification, the marking portion 5 also represents the shelf life of the tape 210 wound on the outer peripheral surface of the core 3, depending on whether or not identification codes 18 are applied to the individual regions 15 of the shelf life marking area 10 by printing or the like.

FIG. 6 illustrates an example in which the identification codes 17 and 18 are applied to all the regions 13 and 15 by printing or the like. In this modification, the identification codes 17 and 18 are applied over the entire periphery of the inner peripheral surface 4 of the core 3. Owing to the inclusion of the width marking area 6, the length marking area 7, the material marking area 8, the adhesive force marking area 9, and the shelf life marking area 10 as described above, the marking portion 5 includes the identification codes 17 and 18, and therefore includes information that indicates the width and length, the material of the base material layer 211, the adhesive force of the adhesive layer 212, and the shelf life of the tape 210 wound on the outer peripheral surface of the core 3.

As the marking portion 5 which represents the type information 220 is applied to the inner peripheral surface 4 of the core 3 of the tape roll 2 in this modification, the collation section 103 can collate type information 220, which is detected by the sensor 91, with reference information 221, which has been registered beforehand, by simply mounting the tape roll 2 on the tape roll support 30. As a result, the tape roll 2 of this modification, similarly to the embodiment of the first aspect, exhibits an advantageous effect of enabling to suppress bonding of a wrong type of adhesive tape to the workpiece 200 without specifically increasing operator's work, in other words, while reducing an increase in operator's man-hour.

The present invention should not be limited to the embodiments, modification, and alternatives described above. In other words, the present invention can be practiced with various modifications within the scope not departing from the spirit of the present invention. In the embodiments and modification described above, the type information 220 indicates the width and length, the material of the base material layer 211, the adhesive force of the adhesive layer 212, and the shelf life of the tape 210 wound on the outer peripheral surface of the core 3. In the present invention, however, the type information 220 may indicate at least one of the width and length, the material of the base material layer 211, the adhesive force of the adhesive layer 212, and the shelf life of the tape 210 wound on the outer peripheral surface of the core 3. In the present invention, the marking portion 5 may therefore include at least one of the width marking area 6, the length marking area 7, the material marking area 8, the adhesive force marking area 9, and the shelf life marking area 10, in other words, may thus include information regarding the width or length, the material of the base material layer 211, the adhesive force of the adhesive layer 212, or the shelf life of the tape 210. Further, the tape 210 may omit the adhesive layer 212 laminated on the base material layer 211. If this is the case, the base material layer 211 may be heated and softened, and then compression-boned directly to the workpiece 200.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tape roll comprising:
   a cylindrical core;
   a strip-shaped tape wound on the core; and
   a marking portion that represents type information of the strip-shaped tape and having slots representing the type information, the slots formed on an inner peripheral surface of the core, the slots spaced at a predetermined distance from an end of the core.

2. The tape roll according to claim 1, wherein the type information of the strip-shaped tape includes at least one piece of type information selected from a group consisting of a width, a length, a material, an adhesive force, and a shelf life of the tape.

3. The tape roll according to claim 1, wherein the slots are each formed over the entire periphery of the inner peripheral surface of the cylindrical core.

4. The tape roll according to claim 1, wherein the slots form a width marking area, a length marking area, a material marking area, an adhesive force marking area, and a shelf life marking area.

5. The tape roll according to claim 1, wherein the marking portion includes two regions representing a first piece of type information.

6. The tape roll according to claim 5, wherein the marking portion includes four regions representing a second piece of type information.

7. A tape roll comprising:
a cylindrical core;
a strip-shaped tape wound on the core; and
a marking portion that represents type information of the strip-shaped tape and having slots representing the type information, the slots formed on an inner peripheral surface of the core, the slots spaced at a predetermined distance from an end of the core, and the marking portion configured to be detected by a sensor that is inserted into the cylindrical core.

8. The tape roll according to claim 7, wherein the type information of the strip-shaped tape includes at least one piece of type information selected from a group consisting of a width, a length, a material, an adhesive force, and a shelf life of the tape, and the marking portion has slots representing the at least one piece of type information.

9. The tape roll according to claim 7, wherein the type information of the strip-shaped tape includes at least one piece of type information selected from a group consisting of a width, a length, a material, an adhesive force, and a shelf life of the tape, and the marking portion has an identification code representing the at least one piece of type information.

10. The tape roll according to claim 7, wherein the marking portion is spaced at a predetermined distance from an end of the core.

11. The tape roll according to claim 7, wherein the marking portion includes two regions representing a first piece of type information.

12. The tape roll according to claim 11, wherein the marking portion includes four regions representing a second piece of type information.

* * * * *